United States Patent
Tu et al.

(10) Patent No.: US 8,853,762 B2
(45) Date of Patent: Oct. 7, 2014

(54) STRUCTURE FOR PROTECTING METAL-INSULATOR-METAL CAPACITOR IN MEMORY DEVICE FROM CHARGE DAMAGE

(75) Inventors: Kuo-Chi Tu, Hsinchu (TW); Kuo-Cheng Chiang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 1035 days.

(21) Appl. No.: 12/323,202

(22) Filed: Nov. 25, 2008

(65) Prior Publication Data

US 2010/0127316 A1   May 27, 2010

(51) Int. Cl.
*H01L 27/108* (2006.01)
*H01L 27/02* (2006.01)
*H01L 49/02* (2006.01)

(52) U.S. Cl.
CPC .... *H01L 27/10894* (2013.01); *H01L 27/10897* (2013.01); *H01L 27/10852* (2013.01); *H01L 27/0255* (2013.01); *H01L 28/60* (2013.01); *H01L 27/10811* (2013.01)
USPC .................... 257/301; 257/304; 257/E27.092

(58) Field of Classification Search
CPC .................................................... H01L 23/5223
USPC .......... 257/303, 355, 304, E27.092, 301, 307, 257/308, 309
See application file for complete search history.

(56) References Cited

U.S. PATENT DOCUMENTS

| | | | |
|---|---|---|---|
| 6,020,643 A | 2/2000 | Fukuzumi et al. | |
| 6,144,074 A * | 11/2000 | Akita | 257/355 |
| 6,255,161 B1* | 7/2001 | Lin | 438/254 |
| 6,627,939 B2* | 9/2003 | Yamaguchi | 257/301 |
| 2002/0140019 A1* | 10/2002 | Nakahata et al. | 257/306 |
| 2007/0004133 A1* | 1/2007 | Kim et al. | 438/253 |
| 2007/0102746 A1* | 5/2007 | Won et al. | 257/303 |
| 2008/0029801 A1* | 2/2008 | Nakamura | 257/303 |
| 2008/0079049 A1* | 4/2008 | Lee et al. | 257/301 |
| 2008/0211022 A1* | 9/2008 | Maeda et al. | 257/347 |

* cited by examiner

*Primary Examiner* — Jerome Jackson, Jr.
*Assistant Examiner* — Paul Budd
(74) *Attorney, Agent, or Firm* — Birch, Stewart, Kolasch & Birch, LLP

(57) ABSTRACT

A dynamic random access memory (DRAM) device has a metal-insulator-metal (MIM) capacitor electrically connected to a PN junction diode through a metal bridge for protecting the MIM capacitor from charge damage generated in back end of line (BEOL) plasma process.

21 Claims, 5 Drawing Sheets

US 8,853,762 B2

STRUCTURE FOR PROTECTING METAL-INSULATOR-METAL CAPACITOR IN MEMORY DEVICE FROM CHARGE DAMAGE

TECHNICAL FIELD

The present invention relates to a semiconductor device, and particularly to a structure and fabrication methods for protecting a metal-insulator-metal capacitor in a memory device from charge damage.

BACKGROUND

In merging logic circuits and dynamic random access memory (DRAM) arrays on a single chip, compatibility is the primary issue with respect to both design and fabrication. Recently, with the continued decrease in device dimensions, it has become increasingly important to embedded DRAM technology. In semiconductor structure, DRAM capacitors have typically been either buried or stacked. Stacked capacitors can be either polycrystalline silicon (poly) or metal-insulator-metal (MIM). The MIM capacitors are embedded in the oxide layers above the active surface of the chip. Because the conductors of the interconnect layers are metal in construction, the capacitors formed between the interconnect layers are preferably of a metal-insulator-metal (MIM) construction to take advantage of processing steps and performance enhancements.

Recent research indicates that the electrical performance of MIM capacitors is strongly correlated with plasma-induced charge damage during deposition or etching process. This is particularly problematic with regard to plasma etching processes in back end of line (BEOL) wiring levels, which develop a high electric field across the top electrode and the bottom electrode of the MIM capacitor to force the charges through the metal lines and the underlying MIM capacitor, degrading the electrical performance and reliability of the MIM capacitor.

Accordingly, a protection methodology is needed to prevent plasma-induced charge damage generated in the fabrication of (BEOL) wiring levels of the MIM capacitor based memory device.

SUMMARY OF THE INVENTION

Embodiments of the invention include a memory device has a capacitor electrically connected to a diode through a metal bridge for protecting the capacitor from charge damage generated in back-end-of-line (BEOL) plasma process.

In one aspect, the invention provides a dynamic random access memory (DRAM) device having a metal-insulator-metal (MIM) capacitor electrically connected to a PN junction diode through a conductive structure.

In another aspect, the invention provides a memory device having a substrate with a memory device region and a protection device region. A capacitor is formed overlying the substrate of the memory device region, including a bottom electrode, a capacitor dielectric and a top electrode having a first portion extending to the protection device region. A diode is formed in the substrate of the protection device region. A contact plug is formed overlying the substrate of the protection device region and electrically connected to the diode. A via plug is formed overlying the substrate of the protection device region and electrically connected to the first portion of the top electrode. A conductive line is formed on the contact plug and the via plug.

In another aspect, the invention provides a semiconductor device having a substrate with a first device region and a second device region. A transistor formed in the first device region has a gate electrode formed on the substrate and source/drain regions formed in the substrate adjacent to sidewalls of the gate electrode. A PN junction diode is formed in the substrate of the second device region. A capacitor formed overlying the transistor in the first device region has a bottom electrode, a capacitor dielectric and a top electrode with a first portion extending to the second device region. A contact plug is formed overlying the substrate of the second device region and electrically connected to the PN junction diode. A via plug is formed overlying the substrate of the second device region and electrically connected to the first portion of the top electrode. A conductive line is formed on and electrically connected to the contact plug and the via plug.

BRIEF DESCRIPTION OF THE DRAWINGS

The aforementioned objects, features and advantages of this invention will become apparent by referring to the following detailed description of the preferred embodiments with reference to the accompanying drawings, wherein.

DETAILED DESCRIPTION OF ILLUSTRATIVE EMBODIMENTS

Figure 1:
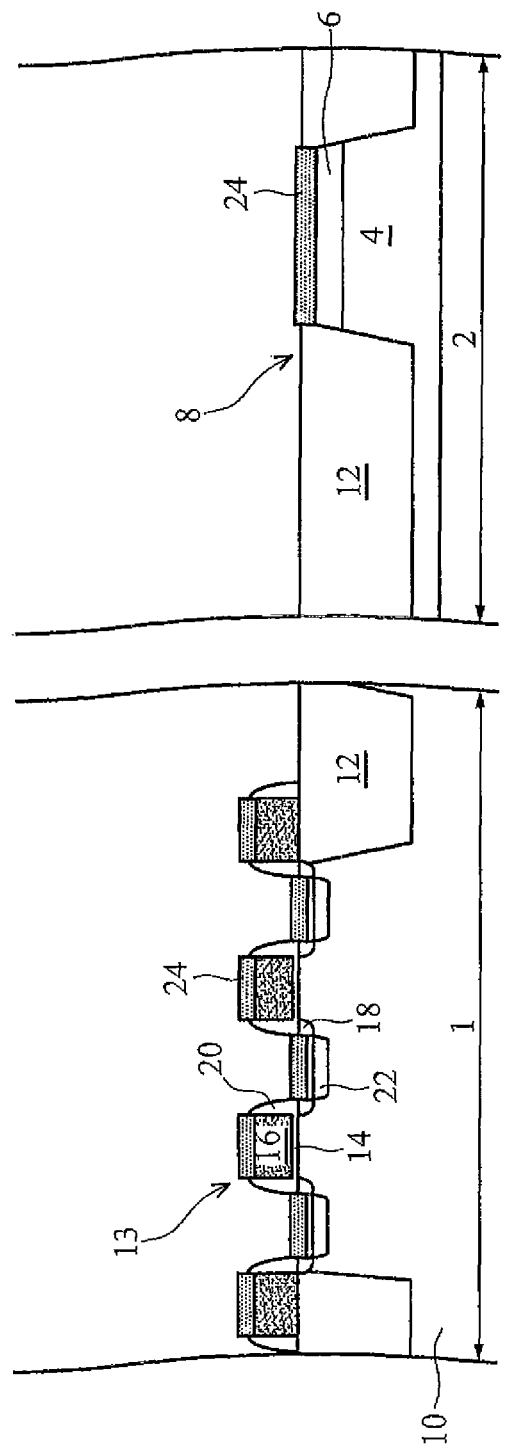
FIG. 1 is a cross-sectional diagram illustrating an exemplary embodiment of the formation of transistors and a protection diode for a MIM capacitor based memory device.

Reference will now be made in detail to the present embodiments, examples of which are illustrated in the accompanying drawings. Wherever possible, the same reference numbers are used in the drawings and the description to refer to the same or like parts. In the drawings, the shape and thickness of one embodiment may be exaggerated for clarity and convenience. This description will be directed in particular to elements forming part of, or cooperating more directly with, apparatus in accordance with the present invention. It is to be understood that elements not specifically shown or described may take various forms well known to those skilled in the art. Further, when a layer is referred to as being on another layer or "on" a substrate, it may be directly on the other layer or on the substrate, or intervening layers may also be present.

Herein, a cross-sectional diagram of FIG. 1 illustrates an exemplary embodiment of the formation of transistors 13 and a protection diode 8 for a MIM capacitor based memory device. A substrate 10, which may be a bulk semiconductor substrate or a silicon-on-insulator substrate, includes a memory device region 1, a protection device region 2 and isolation regions 12. The memory device region 1 is defined for fabricating a DRAM cell array. In one embodiment, the memory device region 1 is an n-type well region for forming p-type transistors. In other embodiments, the memory device region 1 is of p-type. Isolation regions 12 are formed in the substrate 10 to isolate device regions. The isolation regions 12 may be created with approaches including, but not limited to, steps of etching trenches into the substrate, depositing isolating materials (oxide, nitride or combinations thereof into the trenches, polishing off the excess isolating materials, and planarizing the trenches for the next level of fabrication. For example, shallow trench isolation regions are formed to isolate devices.

The protection device region 2 is defined for forming a PN junction diode 8 coupled to a metal bridge, reducing plasma-induced charge damages to MIM capacitors in BEOL processes. In the protection device region 2, the substrate 10 includes a first conductive type well 4 and a second conductive type region 6 formed on the surface of the first conductive type well 4, providing a PN junction diode 8. In one embodiment, the substrate 10 includes a p-type well 4 and an n$^+$-type region 6, forming an n$^+$/p diode. In another embodiment, the substrate 10 includes an n-type well 4 and a p$^+$-type region 6, forming a p$^+$/n diode.

On the memory device region 1, a gate dielectric layer and a gate electrode layer are successively formed on the substrate 10 and then patterned, forming gate dielectrics 14 and gate electrodes 16. The gate dielectrics 14 are formed of silicon oxide, silicon nitride, silicon oxynitride, silicon carbide, or other suitable dielectrics. The gate electrodes 16 are formed of doped polysilicon, metals, metal alloys or silicides, although the materials can be interchangeably used. Lightly doped source/drain regions 18 are then formed in the substrate 10, by implanting appropriate impurities with the gate electrodes 16 as the mask. Next, spacers 20 are formed on the sidewalls of the gate electrodes 16 by blanket depositing a dielectric layer and etching. The spacer 20 may include, for example silicon oxide, silicon nitride, silicon oxynitride, or a combination thereof. Source/drain regions 22 are then formed in the substrate 10, by implanting appropriate impurities with the spacers 20 and gate electrodes 16 as the mask. The types of the source/drain regions 22 depend on the types of the devices to be formed. In one embodiment, the source/drain region 22 is of p-type. In alternative embodiments, the source/drain region 22 is of n-type. Silicide regions 24 are formed on the exposed regions of the gate electrodes 16 and source/drain regions 22 to reduce contact resistance. To form silicide regions, a metal layer is blanket deposited, and an annealing is then performed so that the metal layer forms silicide regions with underlying silicon. The un-reacted metal layer is then removed. The silicide regions 24 may include WSi, CoSi, NiSi, or TiSi. The silicide region 24 is also formed on the second conductive type region 6 of the PN junction diode in the protection device region 2.

Figure 2:
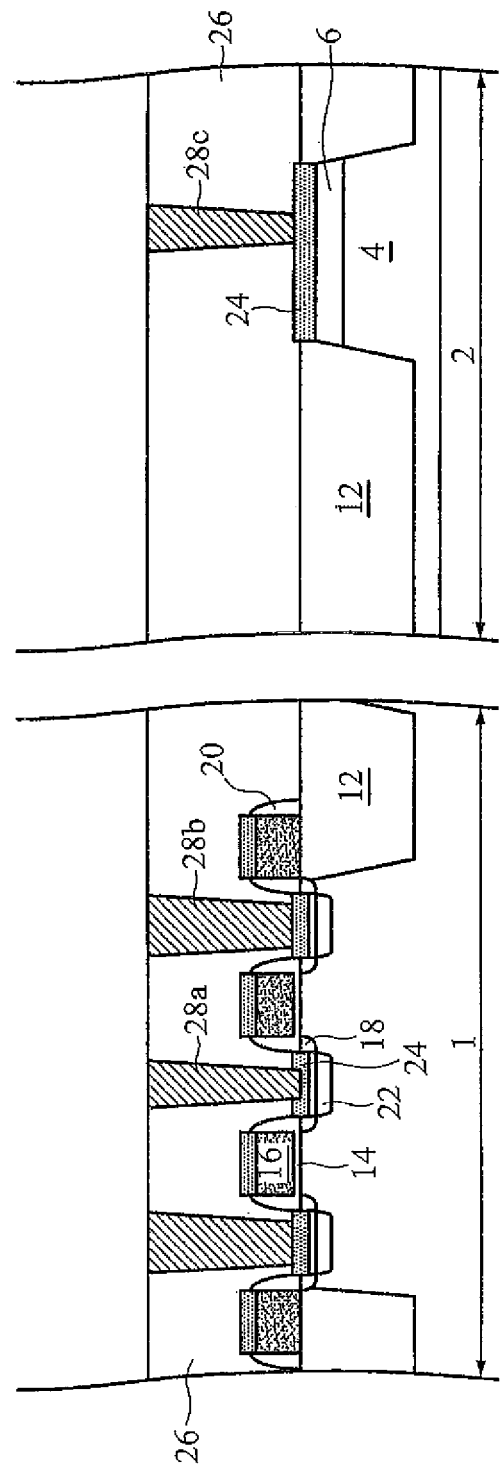
FIG. 2 is a cross-sectional diagram illustrating the formation of a first dielectric layer and first contact plugs.

FIG. 2 is a cross-sectional diagram illustrating the formation of a first dielectric layer 26 and first contact plugs 28. The first dielectric layer 26, sometimes referred to as an inter-layer dielectric (ILD) layer, is formed on the substrate 10 through any of a variety of techniques, including, LPCVD (low-pressure chemical vapor deposition), APCVD (atmospheric-pressure chemical vapor deposition), PECVD (plasma-enhanced chemical vapor deposition), spin-on coating, and future-developed deposition procedures. The material used to form the first dielectric layer 26 may include, for example silicon oxide, silicon nitride, silicon oxynitride, low-k dielectric materials, other isolating materials, or combinations thereof. Next, an anisotropic etching process, i.e., etch back process, or a planarization technology, i.e., CMP (chemical mechanical polish) process may be employed. First contact openings are then formed through the first dielectric layer 26, exposing underlying silicide regions 24. Conductive materials are filled into the contact openings, forming first contact plugs 28a, 28b and 28c in the memory device region 1 and the protection device region 2, respectively. The first contact plugs 28 are formed of tungsten or tungsten alloys. The first contact plugs 28 may also have a composite structure further comprising a diffusion barrier layer, for example Ti or TiN. In other embodiments, aluminum, copper, or other well known alternatives can be used to form the contacts.

Figure 3:
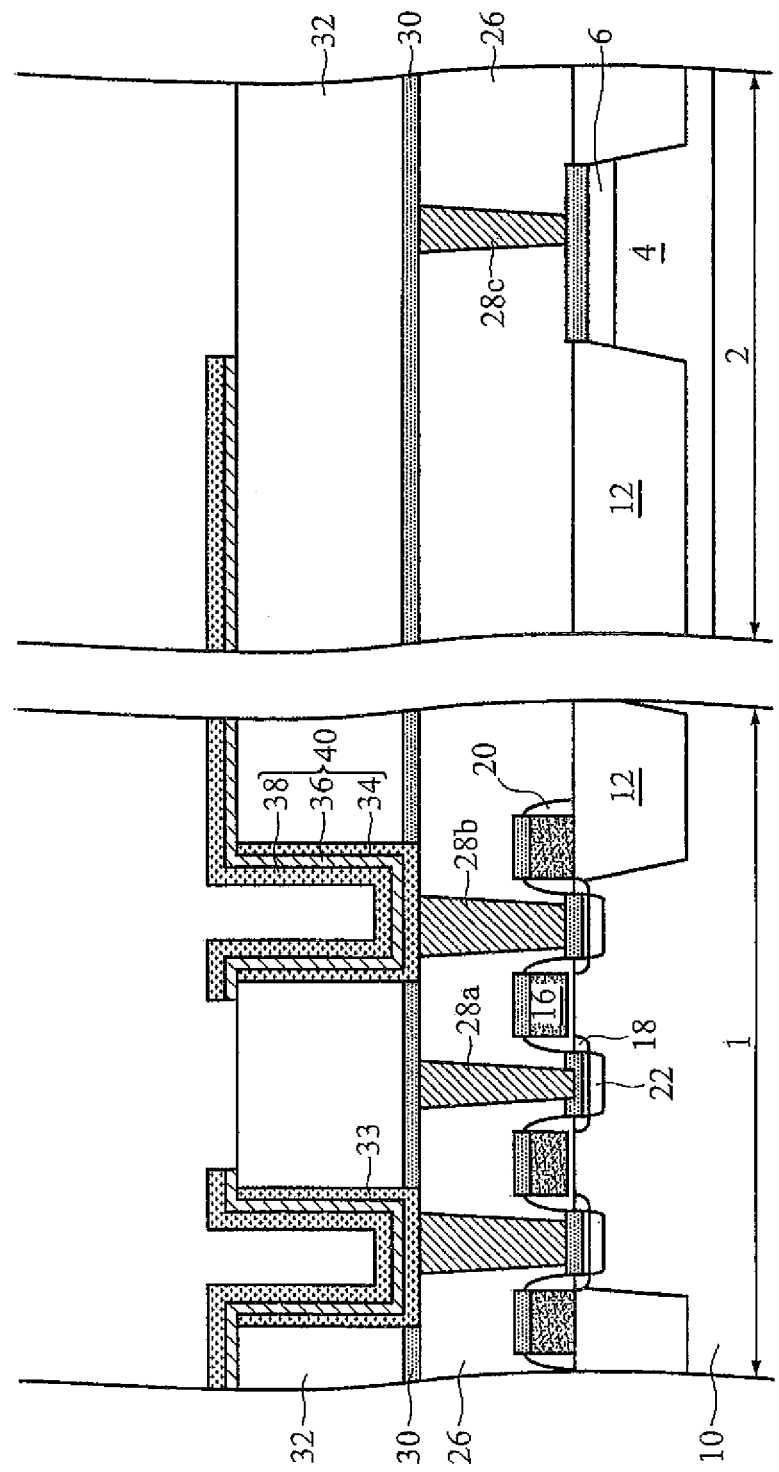
FIG. 3 is a cross-sectional diagram illustrating the formation of a second dielectric layer and a MIM capacitor.

FIG. 3 is a cross-sectional diagram illustrating the formation of a second dielectric layer 32 and a MIM capacitor 40. Optionally, an etch stop layer 30 is formed over the first dielectric layer 26. A second dielectric layer 32, also referred to as a crown oxide, is formed over the etch stop layer 30. The second dielectric layer 32 is formed of plasma enhanced chemical vapor deposition (PE-CVD) oxide, or high-density plasma (HDP) oxide, although other low-k dielectric materials can be used. Openings 33 are then formed by etching the second dielectric layer 32 and the etch stop layer 30, exposing contacts 28b. A bottom electrode layer 34 is formed on the second dielectric layer 32 to line the bottoms and sidewalls of the openings 33, and a chemical mechanical polish (CMP) is then performed to remove portions of the bottom electrode layer 34 on the second dielectric layer 32, leaving bottom electrodes 34. The bottom electrode layer 34 comprises conductive materials such as doped polysilicon (and the respective capacitor is referred to as poly-insulator-poly type), Ti, Co, TiN, TiW, W, TiAl, TiAlN, and combinations thereof, and is formed using methods such as chemical vapor deposition (CVD), sputter deposition, and the like. It may also have a composite structure comprising a diffusion barrier layer and a top conductive layer. When the bottom electrode and subsequently formed top electrode are formed of metal, the respective capacitor is referred to as metal-insulator-metal type. Next, a capacitor dielectric layer 36 and a top electrode layer 38 are formed on the bottom electrodes 34 and the second dielectric layer 32, and then patterned to form a capacitor 40 including a top electrode 38, an insulator 36 and a bottom electrode 34. The capacitor 40 is referred to as a cup-type capacitor since bottom electrode 34 has a cup shaped region. In other embodiments, the capacitor is referred to as a cylinder-type capacitor since bottom electrode has a cylinder-shaped. The top electrode 38 includes a portion extending to the protection device region 2 for electrically connected to a cell plate voltage (VCP).

Figure 4:
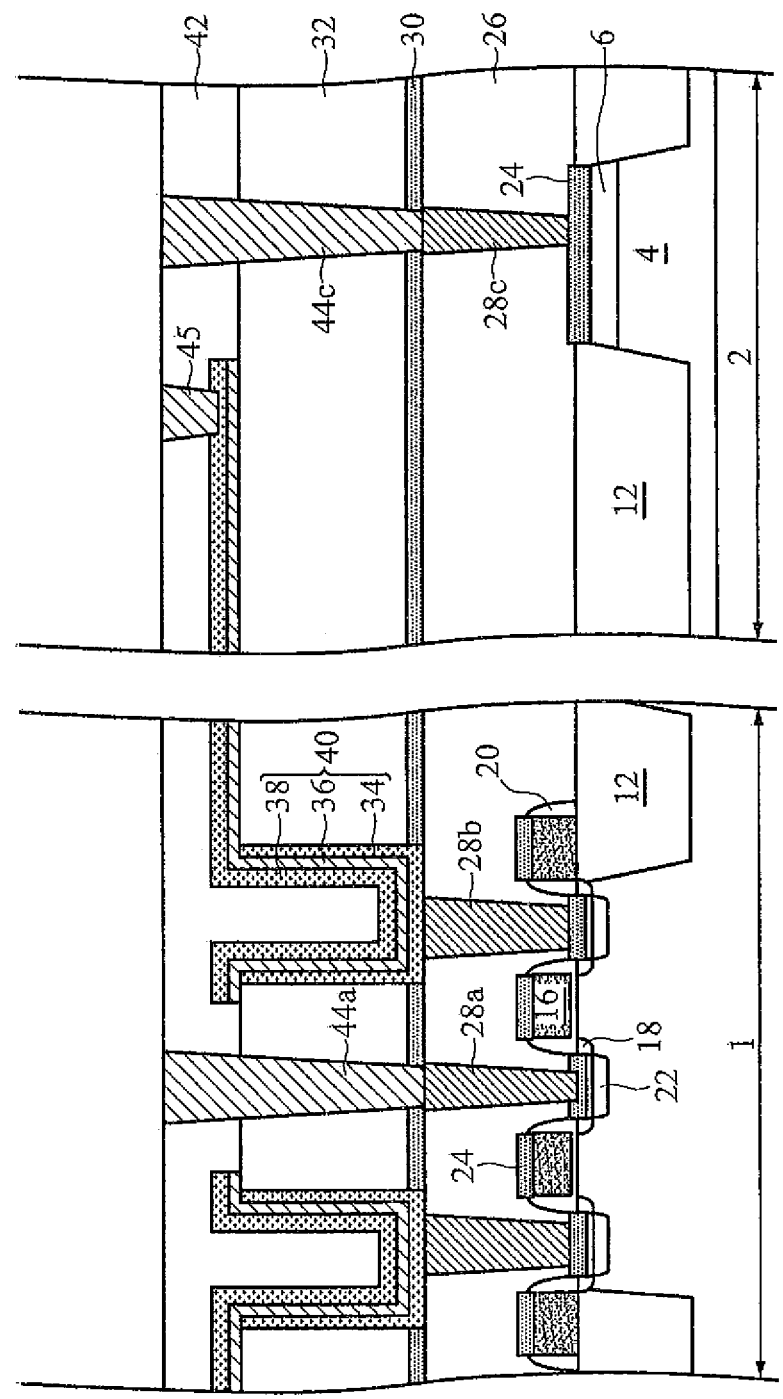
FIG. 4 is a cross-sectional diagram illustrating the formation of a third dielectric layer and second contact plugs.

FIG. 4 is a cross-sectional diagram illustrating the formation of a third dielectric layer 42 and second contact plugs 44. A third dielectric layer 42 is formed on the second dielectric layer 32 and the capacitors 40. Besides filling the cup shaped region of the capacitors 40, the third dielectric layer 42 includes a portion with a thickness over the capacitors 40. Materials used to form the third dielectric layer 42 include PE-CVD dielectric, HDP dielectric, doped dielectric materials comprising carbon and silicon, porous materials, and combinations thereof. In an embodiment, materials for forming the third dielectric layer 42 having a k value of between about 2.3 and about 3.8 include fluorosilicate glass (FSG), carbon-doped silicate glass, and combinations thereof. In an embodiment, materials for forming the third dielectric layer 42 having a k value of between about 1.2 and about 2.3 include carbon-doped silicate glass, porous dielectric, and combinations thereof. Next, an anisotropic etching process, i.e., etch back process, or a planarization technology, i.e., CMP (chemical mechanical polish) process can be employed on the third dielectric layer 42.

Second contact openings are then formed through the third dielectric layer 42, the second dielectric layer 32 and the etch stop layer 30, exposing underlying first contact plugs 28a and 28c. In addition, a via opening is formed through the third dielectric layer 42 to expose the extending portion of the electrode layer 38. Conductive materials are filled into the second contact openings and the via opening to form a second contact plug 44a electrically connected to the first contact plug 28a in the memory device region 1, another second contact plug 44c electrically connected to the first contact plug 28c and a via 45 electrically connected to the extending portion of the top electrode 38 in the protection device region 2, respectively. The second contact plugs 44a, 44c and via 45 are formed of tungsten, tungsten alloys, copper or copper alloys. The second contact plugs 44a, 44c and via 45 may also have a composite structure further comprising a diffusion barrier layer, for example Ti or TiN.

Figure 5:
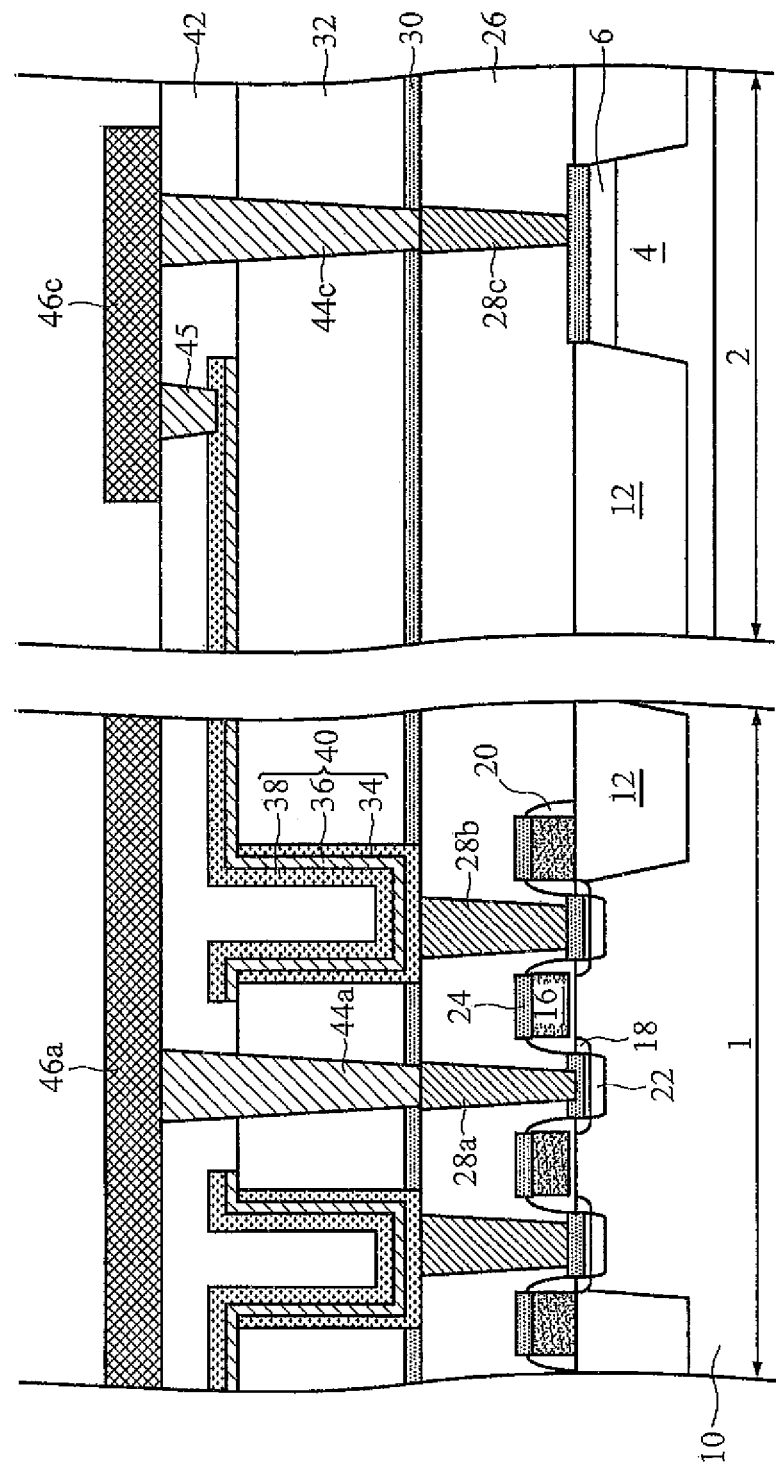
FIG. 5 is a cross-sectional diagram illustrating the formation of conductive lines including a bitline and an intermediate interconnection.

FIG. 5 is a cross-sectional diagram illustrating the formation of conductive lines 46 including a bitline 46a and an intermediate interconnection 46c in a first metallization layer. A conductive layer is deposited on the third dielectric layer 42 and patterned, forming conductive lines 46 including a bitline 46a in the memory cell region 1 and an intermediate interconnection 46c in the protection device region 2. The bitline 46a and the intermediate interconnection 46c are conductor lines of copper or copper alloys. The bitline 46a can electrically connect to the source/drain region 22 through the contact plugs 44a and 28a. The intermediate interconnection 46c where a cell plate voltage (VCP) can be applied to, can electrically connect to one terminal of the capacitor 40 through the via 45 and electrically connect to the PN junction diode through the contact plugs 44c and 28c as well.

FIG. 5 illustrates the protection of the MIM capacitor by using PN junction diode and metal bridges. The top electrode is connected to the PN junction diode by the same metal level, and the other capacitor plate is left floating, thus all conductors connected to the substrate can act as an antenna of the connected plate. In this way, plasma-induced charge damages to the capacitor can be reduced, enhancing reliability. In addition, the embodiments have several advantageous features. First, the fabrication of the PN junction diode and metal bridge is fully compatible with the existing capacitor fabrication processes, and there is no extra cost involved. Secondly, the process flow is simplified. Thirdly, the yield is increased.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A memory device, comprising:
 a substrate having a memory device region and a protection device region;
 a first dielectric layer formed on the substrate;
 a second dielectric layer formed on the first dielectric layer;
 an opening formed in the second dielectric layer of the memory device region;
 a cup type capacitor formed overlying the substrate of the memory device region, wherein the cup type capacitor comprises a bottom electrode, a capacitor dielectric layer and a top electrode having a first portion extending to the protection device region, and wherein the bottom electrode is formed on the second dielectric layer to directly line the bottoms and sidewalls of the opening;
 a diode formed in the substrate of the protection device region, wherein the diode is a PN junction diode and includes:
  a first semiconductor type well in the substrate;
  a second semiconductor type region above the first semiconductor type well; and
  a silicide region above the second semiconductor type region, wherein one of the first semiconductor type and the second semiconductor type is a p type, the other one of the first semiconductor type, and the second semiconductor type is an n type, and the substrate is of the second semiconductor type;
 a contact plug formed overlying the substrate of the protection device region and electrically connected to the diode;
 a via plug formed overlying the substrate of the protection device region and electrically connected to the first portion of the top electrode; and
 a conductive line formed on the contact plug and the via plug.

2. The memory device of claim 1, wherein the diode is a PN junction diode.

3. The memory device of claim 2, wherein the PN junction diode comprises a p-type well in the substrate and an n+-type region on the surface of the p-type well.

4. The memory device of claim 2, wherein the PN junction diode comprises an n-type well in the substrate and a p+-type region on the surface of the n-type well.

5. The memory device of claim 2, further comprising a silicide region on the PN junction diode.

6. The memory device of claim 1, further comprising
 a third dielectric layer formed on the second dielectric layer, wherein the first portion of the top electrode extending to the protection device region is formed between the second dielectric layer and the third dielectric layer;
 wherein the conductive line is formed on the third dielectric layer;
 wherein the contact plug penetrates the first, second and third dielectric layers to have one end connected to the diode and the other end connected to the conductive line; and
 wherein the via plug is formed in the third dielectric layer to have one end connected to the first portion of the top electrode and another end connected to the conductive line.

7. The memory device of claim 6, wherein the contact plug comprises a first contact plug formed in the first dielectric layer, and a second contact plug formed in the second and third dielectric layers.

8. The memory device of claim 1, wherein the cup type capacitor is of a metal-insulator-metal (MIM) type.

9. The memory device of claim 1, wherein the contact plug is in physical contact with the silicide region, and the second semiconductor type region is in physical contact with the silicide region and the first semiconductor type well.

10. A semiconductor device, comprising:
 a substrate having a first device region and a second device region;

a transistor formed in the first device region, comprising a gate electrode formed on the substrate and source/drain regions formed in the substrate adjacent to sidewalls of the gate electrode;

a PN junction diode formed in the substrate of the second device region, wherein the PN junction diode includes:
a first semiconductor type well in the substrate;
a second semiconductor type region above the first semiconductor type well; and
a silicide region above the second semiconductor type region, wherein one of the first semiconductor type and the second semiconductor type is a p type, the other one of the first semiconductor type, and the second semiconductor type is an n type, and the substrate is of the second semiconductor type;

a first dielectric layer formed on the substrate;

a second dielectric layer formed on the first dielectric layer;

an opening formed in the second dielectric layer of the first device region;

a cup type capacitor formed overlying the transistor in the first device region, comprising a bottom electrode, a capacitor dielectric layer and a top electrode having a first portion extending to the second device region, and wherein the bottom electrode is formed on the second dielectric layer to directly line the bottoms and sidewalls of the opening;

a contact plug formed overlying the substrate of the second device region and electrically connected to the PN junction diode;

a via plug formed overlying the substrate of the second device region and electrically connected to the first portion of the top electrode; and a conductive line formed on and electrically connected to the contact plug and the via plug.

11. The semiconductor device of claim 10, wherein the PN junction diode comprises a p-type well in the substrate and an n+-type region on the surface of the p-type well.

12. The semiconductor device of claim 10, wherein the PN junction diode comprises an n-type well in the substrate and a p+-type region on the surface of the n-type well.

13. The semiconductor device of claim 10, further comprising a silicide region on the PN junction diode, the gate electrode and the source/drain regions.

14. The semiconductor device of claim 10, further comprising
a third dielectric layer formed on the second dielectric layer, wherein the first portion of the top electrode extending to the second device region is formed between the second dielectric layer and the third dielectric layer;
wherein the conductive line is formed on the third dielectric layer;
wherein the contact plug penetrates the first, second and third dielectric layers to have one end connected to the diode and the other end connected to the conductive line; and
wherein the via plug is formed in the third dielectric layer to have one end connected to the first portion of the top electrode and another end connected to the conductive line.

15. The semiconductor device of claim 14, wherein the contact plug comprises a first contact plug formed in the first dielectric layer, and a second contact plug formed in the second and third dielectric layers.

16. The semiconductor device of claim 10, wherein the cup type capacitor is of a metal-insulator-metal (MIM) type.

17. The semiconductor device of claim 10, wherein the contact plug is in physical contact with the silicide region, and the second semiconductor type region is in physical contact with the silicide region and the first semiconductor type well.

18. A dynamic random access memory (DRAM) device, comprising:
a substrate having a first device region and a second device region;
a cup type metal-insulator-metal (MIM) capacitor and a transistor formed on the first device region; and
a PN junction diode formed on the second region, wherein the cup type MIM capacitor is electrically connected to the PN junction diode through a conductive structure, wherein the cup type MIM capacitor is formed in an opening and comprises a bottom electrode, a capacitor dielectric layer and a top electrode, and the bottom electrode directly lines the bottoms and sidewalls of an opening,
wherein the PN junction diode includes:
a first semiconductor type well in the substrate;
a second semiconductor type region above the first semiconductor type well; and
a silicide region above the second semiconductor type region, wherein one of the first semiconductor type and the second semiconductor type is a p type, the other one of the first semiconductor type, and the second semiconductor type is an n type, and the substrate is of the second semiconductor type.

19. The DRAM device of claim 18, wherein the PN junction diode comprises a p-type well in a semiconductor substrate and an n+-type region on the surface of the p-type well, and the conductive structure is electrically connected to the n+-type region.

20. The DRAM device of claim 18, wherein the conductive structure is electrically connected to the top electrode of the MIM capacitor.

21. The DRAM device of claim 18, wherein the conductive structure is in physical contact with the silicide region, and the second semiconductor type region is in physical contact with the silicide region and the first semiconductor type well.

* * * * *